United States Patent [19]

Ishihara

[11] 3,983,573

[45] Sept. 28, 1976

[54] CHARGE-COUPLED LINEAR IMAGE SENSING DEVICE

[75] Inventor: Yasuo Ishihara, Tokyo, Japan

[73] Assignee: Nippon Electric Company, Ltd., Tokyo, Japan

[22] Filed: Mar. 12, 1975

[21] Appl. No.: 557,845

[30] Foreign Application Priority Data
  Mar. 12, 1974 Japan............................ 49-28234
  Feb. 24, 1975 Japan............................ 50-23189

[52] U.S. Cl. .................................. 357/24; 357/30; 307/221 D; 307/304
[51] Int. Cl.² ................. H01L 29/78; H01L 27/14; H01L 31/00; H03K 3/353
[58] Field of Search ............... 357/24, 30; 307/304, 307/311, 221 D

[56] References Cited
  UNITED STATES PATENTS
  3,814,955   6/1974   Itoh et al. .............................. 357/24
  3,866,067   2/1975   Amelio ................................. 357/24
  3,940,602   2/1976   Lagnado et al. ...................... 357/24

OTHER PUBLICATIONS

Radio–Electronics (8/73) pp. 56–57.
J. Carnes "Charge–Coupled Imaging: State of the Art" 3rd European Solid State Device Research Conf., Munich, 1973 Publ. in *Solid State Devices*, 1973 Conf. Series No. 19, Institute of Physics, London.

Primary Examiner—William D. Larkins
Assistant Examiner—Gene M. Munson
Attorney, Agent, or Firm—Sughrue, Rothwell, Mion, Zinn and Macpeak

[57] ABSTRACT

An improved charge-coupled linear image sensing device which makes a greater number of image sensor elements available in a sensing area without necessarily increasing the driving frequency and without sacrificing the overall charge-transfer efficiency. The device includes two groups of charge-transfer arrays, each including two one-dimensional arrays separated from each other by control electrodes, and disposed on both sides of a one-dimensional image sensor array, respectively.

4 Claims, 15 Drawing Figures

CHARGE-COUPLED LINEAR IMAGE SENSING DEVICE

BACKGROUND OF THE INVENTION

1. Field of the Invention

The present invention relates to charge-coupled devices, and more particularly to charge-coupled linear image devices which accomodates a greater number of image sensor elements in a sensing area.

2. Description of the Prior Art

Charge-coupled linear image sensing devices are such as described in an article titled "Interlacing in Charge-Coupled Imaging Devices" by Carlo H. Sequin, IEEE Transactions on Electron Devices, Vol. ED-20, No. 6(June, 1973), pp. 535–541, and in a catalog for "500-Element Charge Coupled Linear Image Sensor", published by Fairchild Camera and Instrument Corporation. In these conventional devices, an image sensor array includes a number of image sensor elements arranged in one-dimensional fashion and is installed separately from charge transfer arrays. The charge transfer arrays are usually two in number and disposed on both sides of the image sensor array for transferring the charge developed in the image sensor array in response to incident light rays.

In these devices, however, the drive frequency must be as high as several megahertz to address a substantial number of image sensor elements in the sensing area. Furthermore, the charge transfer efficiency from one stage to another in a charge-coupled device is not 100%, the overall charge-transfer efficiency decreasing as the number of charge-transfer stages increases. For these reasons, it has thus far been nearly impossible to accomodate a desired number of image sensor elements in the sensing area.

SUMMARY OF THE INVENTION

Therefore, it is an object of the present invention to provide an improved charge-coupled linear image sensing device which accomodates a greater number of image sensor elements in the sensing area without necessarily increasing the driving frequency and without sacrificing the overall charge-transfer efficiency.

According to the present invention, there is provided a charge-coupled linear image sensing device in which the two groups of charge-transfer arrays, each comprising two one-dimensional arrays separated from each other by a control electrode, are disposed on both sides of a one-dimensional image sensor array, respectively.

The features and advantages of the present invention will be better understood from the following detailed description of preferred embodiments of the present invention when taken in conjunction with the accompanying drawings.

Figure 1:
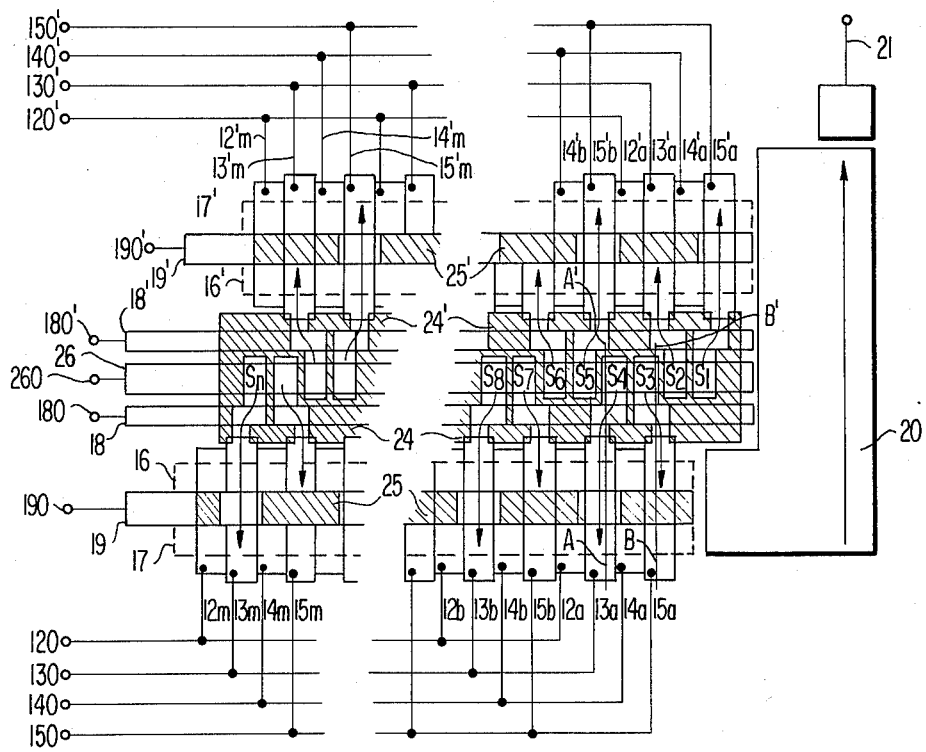
FIG. 1 is a schematic plan view of a first embodiment of the present invention.

With reference now to FIG. 1, a first embodiment of the present invention comprises: a one-dimensional image sensor array S composed of image sensor elements $S_1, S_2, S_3 \ldots S_n$ in which signal charges are generated by the incident light during the period a pulse voltage is applied to an electrode 26; charge-transfer arrays 16, 17, 16' and 17'; transfer gate electrodes 18 and 18' for controlling the transfer of the charge accumulated in the image sensor array S to the transfer arrays 16, 17, 16' and 17'; control electrodes 19 and 19' for controlling charge transfer between the transfer arrays 16 and 17 and between the transfer arrays 16' and 17', respectively; and transfer electrodes 12a through 12m, 12a' through 12m', 13a through 13m, 13a' through 13m', 14a through 14m, 14a' through 14m', 15a through 15m, and 15a' through 15m'. To the transfer electrodes 12a through 12m and 12a' through 12m' are applied a first transfer pulse train from terminals 120, respectively and 120'. Similarly, a second transfer pulse train is applied from terminals 130 and 130' to the transfer electrodes 13a through 13m and 13a' through 13m', respectively; a third transfer pulse train from terminals 140 and 140' to the transfer electrodes 14a through 14m and 14a' through 14m', respectively; and a fourth transfer pulse train from terminals 150 and 150' to the transfer electrodes 15a through 15m and 15a' through 15m', respectively. The transfer gate electrodes 18 and 18' are connected to each other to receive a gate pulse thereto. Similarly, the control electrodes 19 and 19' are connected to each other for the application of a control pulse thereto.

In operation, the charge developed at the sensor element $S_1$ is transferred to the transfer array 17', while those developed $S_2, S_3$ and $S_4$ are transferred to the arrays 16', 16 and 17, respectively. Similarly, the charges at $S_5, S_6, S_7$ and $S_8$ are transferred to the arrays 17', 16', 16 and 17, respectively. As will be described later in more detail, all of these initial charge transfers or read-outs from the image sensor array S to the transfer arrays 17', 16', 16, and 17 are performed simultaneously, followed by the succeeding rightward transfer (or shift). As will be apparent, the transfer arrays 17', 16', 16, and 17 respectively handle the charges developed at every fourth sensor element. Thus, the above-mentioned initial transfers are followed by the parallel rightward transfer by way of the four transfer arrays 17', 16', 16, and 17.

The transfer operation of the accumulated charges from the sensor array S to the transfer arrays will be described in detail by referring to FIGS. 2 and 3. For the simplicity of illustration, only the transfer of charges from the sensor elements $S_4$ and $S_3$ to the transfer arrays 17 and 16 will be described.

Referring to FIGS. 2 and 3 together with FIG. 1, a charge accumulating medium 10 made of an n-type silicon is coated with a dielectric layer 11 such as a silicon dioxide layer. The sensing electrode 26, the transfer gate electrode 18, the transfer electrodes 13a (FIG. 2) and 15a (FIG. 3), and the control electrode 19 are disposed on the silicon dioxide layer 11. An isolation layer 24 is provided in the silicon substrate 10 to prevent the transfer of a charge at a sensor element to undesired transfer arrays to which that particular sensor element is not supposed to be coupled with.

Figure 2A:
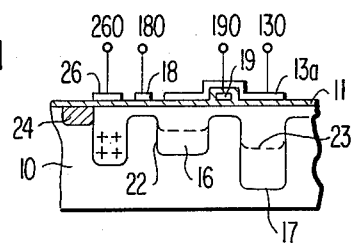
FIGS. 2a, and 2b and 2c are sectional views taken along the line A – A' in FIG. 1 for illustrating the operation of the first embodiment.
Figure 3A:
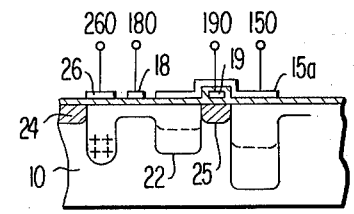
FIGS. 3a, 3b and 3c are sectional views taken along the line B–B' in FIG. 1 for illustrating the operation of the first embodiment.

In FIGS. 2a and 3a, the solid line 22 and the broken line 23 represent substrate surface potentials appearing respectively when pulses are applied to the sensing electrode 26 and to the transfer electrode 13a (FIG. 2a) or 15a (FIG. 3a) and when the pulses applied are removed from these electrodes. It is evident that the nearer the surface of the substrate, the higher becomes the potential. As shown in FIGS. 2a and 3a, there is a difference in surface potential between the transfer arrays 16 and 17 beneath the transfer electrode for the reason to be described later. Various methods of realizing different surface potentials under the same electrode, have been proposed including, for example, adjustment of the thickness of the dielectric layer 11, localization of a charge in the dielectric layer 11, adjustment of the density of the impurity content in the substrate, or adjustment of the density of the channel region by means of a charge-coupled device called the buried channel.

When a pulse is applied to the sensing electrode 26 from a terminal 260, a potential well, indicated by the solid line 22, is formed in the substrate (image sensor element $S_4$ or $S_3$) in the area beneath the electrode 26, as shown in FIGS. 2a and 3a. When light is incident thereupon, electronhole pairs are produced in the substrate, and the holes, i.e., the minority charges, are accumulated in the potential well. The symbol + indicates the accumulated information charge. The transfer pulse trains applied to the transfer electrodes are so timed that the transfer may be carried out during the time period needed for the subsequent development of charges at the sensor elements, or in other words, that the read-out and charge-up may be performed alternatingly. Therefore, the isolation of the potential wells between the sensor array S and the transfer array 16 and between the transfer arrays 16 and 17 must be provided by a pulse voltage applied to the transfer gate electrode 18 and to the control electrode 19, respectively. Although not illustrated in the figures, it is desirable that the surface where light is incident, excepting the sensor array area, be shielded from light.

Figure 2B:
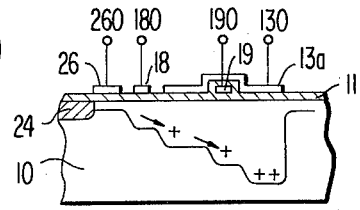
Figure 2C:
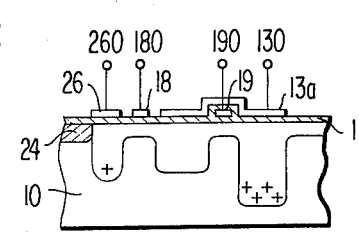

As shown in FIG. 2b, the information charge accumulated in the sensor element $S_4$ is transferred to the transfer array 17 by sequentially applying pulses with their durations overlapped to the electrodes 26, 18, 19 and 13a in that order. After the transfer of the information charge from the sensor element $S_4$ to the second transfer array 17, the pulses applied to the transfer gate electrode 18 and to the control electrode 19 are turned off to isolate the sensor element $S_4$ from the transfer array. Then a pulse is applied again to the sensing electrode 26 to cause information charges to be accumulated again in the sensor element $S_4$ as shown in FIG. 2c. The charge in the transfer array 17 is transferred rightward as viewed in FIG. 1 by applying transfer pulses to the electrodes from the terminal 120, 130, 140 and 140.

Figure 3B:
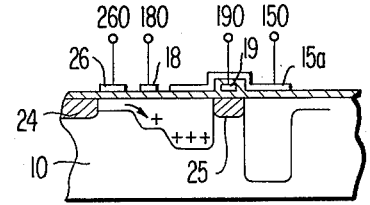
Figure 3C:
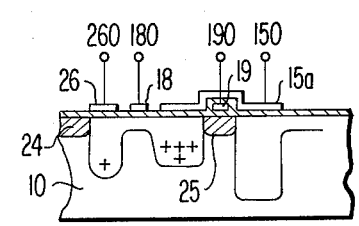

As shown in FIG. 3a, information charge is accumulated in the potential well beneath the sensor element $S_3$ in the same manner as described by referring to FIG. 2a. Pulses are applied to the electrodes 26, 18, 19 and 15a in that order, to transfer the information charge from the sensor element $S_3$ to the transfer array 16. While, as shown in FIG. 3b, there is beneath the control electrode 19 an isolation layer 25 which has been formed by $N^+$ diffusion or the like. Hence, in this region, the surface potential is high irrespective of the potential at the control electrode 19. As a result, the information charge from the sensor element $S_3$ is transferred to the transfer array 16 as shown in FIG. 3b after pulses are applied in sequence to the electrodes 26, 18, 19 and 15a. Then the application of a pulse to the control electrodes 18 and 19 is stopped in the manner as described by referring to FIG. 2c, and a pulse is applied again to the sensing electrode 26. Thus, as shown in FIG. 3c, the accumulation of information charges begins.

The operation of the embodiment of FIG. 1 will now be described as a whole.

When a pulse is applied to the sensing electrode 26 from the terminal 260, potential wells are formed in the individual sensor elements $S_1, S_2, S_3 \ldots S_n$ isolated from each other by the isolation layer 24 formed in the substrate 10. Minority charges produced in quantities corresponding to the intensities of light incident upon the individual sensor elements are accumulated in the potential wells respectively. In order to transfer the information charges, which have been accumulated in the sensor elements for a given period of time, to the corresponding transfer arrays, the pulse being applied to the sensing electrode 26 is turned off. At the same time, pulses are applied in sequence, with their durations overlapped, to the terminal 180 and 180' (leading to the transfer gate electrodes 18 and 18'), the terminals 130, 130', 150 and 150' (both are applied simutaneously), and the terminals 190 190' (the control electrodes 19 and 19') in this order. By this operation, the information charge in the sensor element $S_1$ is transferred to the transfer array 17' beneath the electrode 15a'; the charge in the sensor element $S_2$ to the transfer array 16' beneath the electrode 13a'; the charge in the sensor element $S_3$ to the transfer array 16 beneath the electrode 15a; the charge in the sensor element $S_4$ to the transfer area 17 beneath the electrode 13a; and so on. Thus the information charges in the sensor array S are transferred to four transfer arrays 17', 16', 16 and 17, or every fourth information charge is transferred to the same transfer array. After the transfer of the charges from the sensor array to the tranfer arrays, the pulses applied to the transfer gate electrode 18 and the control electrode 19 are turned off whereby the sensor arrays are separated from the individual transfer arrays.

The charges transferred to the individual transfer arrays are further transferred in the following manner. The charges beneath the electrodes connected to the terminal 130 (130') are transferred forward by the distance of two electrodes by applying pulses to the terminals 140 (on), 130 (off), and 140 (off) in this order. As a result, the information charges in the transfer arrays 16 and 17 come undermath the same electrode. Then, on the principle of a four-phase driven charge-coupled device, the information charges are transferred along the electrodes by applying the first, second, third and fourth transfer pulse trains from the terminals 120, 130, 140 and 150 to the respective electrodes in that order. The charges to a signal read-out means 21 by the use of a read array 20 of the structure similar to that of the transfer array, forming part of a four-phase driven charge-coupled device.

Figure 4:
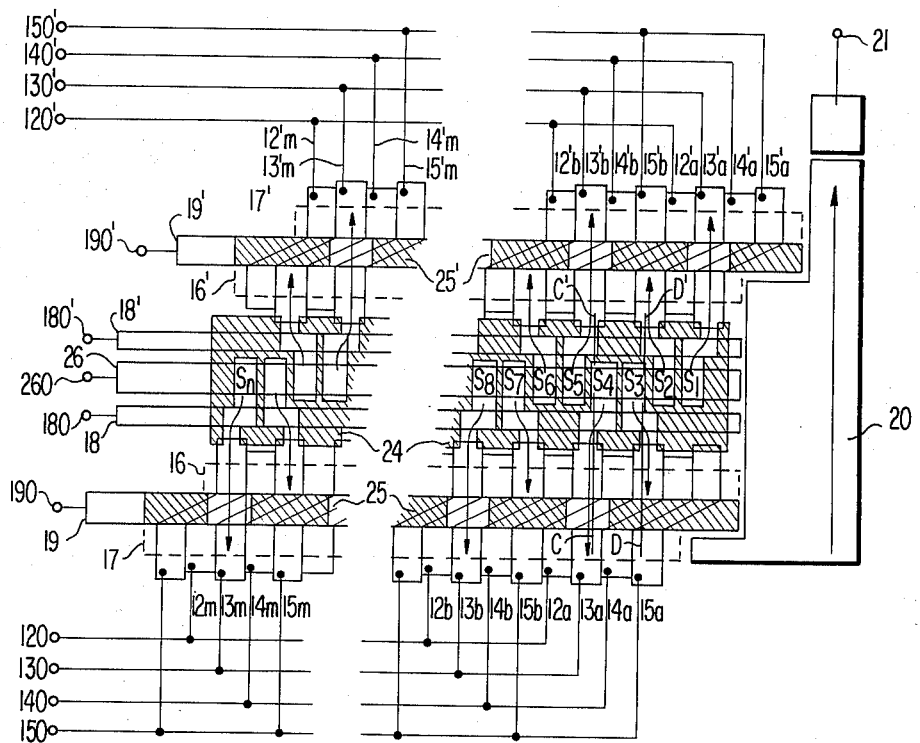
FIG. 4 is a schematic plan view of a second embodiment of the present invention.

Referring to FIG. 4, a second embodiment of the present invention also comprises the image sensor array S, the transfer gate electrodes 18 and 18', the transfer arrays 16, 16', 17 and 17', and the control electrodes 19 and 19'. Like constituent components are indicated by the identical numerical references in FIG. 1. In the second embodiment, the transfer electrodes 12a, 13a, 14a, 15a, 12b . . . , are disposed slantingly with respect to the control electrode 19 so that the electrode groups on the transfer arrays 16 and 17 deviate from each other by one half of the interval of the transferring elements. (In the case of a four-phase driven device, one transferring element corresponds to four electrodes). Further, as shown in FIGS. 5a and 6a, the surface potentials are the same in the transfer arrays 16 and 17.

The operation of the second embodiment shown in FIG. 4 will be described by referring to FIGS. 5 and 6.

Figure 5A:
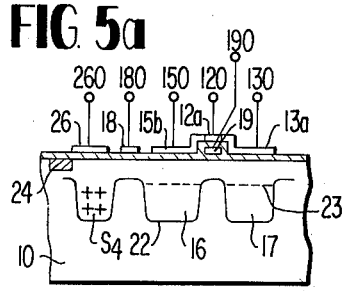
FIGS. 5a, 5b and 5c are sectional views taken along the line C–C' in FIG. 4 for illustrating the operation of the second embodiment.
Figure 5B:
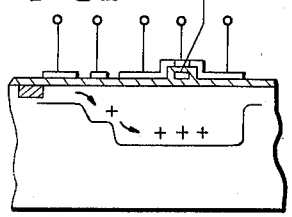
Figure 5C:
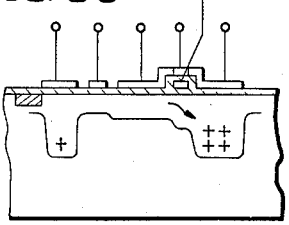

Referring to FIG. 5a, a pulse is applied to a sensing electrode 26 whereby a potential well is formed in the substrate (sensor element $S_4$) beneath the sensing electrode 26. The minority charges, indicated by +, which have been produced by the incident light are accumulated in the potential well. These information charges are transferred to the transfer arrays 16 and 17, as shown in FIG. 5b by applying pulses, with their durations overlapped, in sequence to the electrodes 26 and 18, and the electrode 19 simultaneous with the terminals 130 and 150. Then the pulse applied to the transfer gate electrode 18 is turned off and a pulse is applied again to the sensing electrode 26, to cause charges of light information to be accumulated again in the sensor element $S_4$. The charge transferred to the transfer array 16 is transferred to the transfer array 17 beneath the electrode 13a when the pulse applied to the electrodes 15b and 19 is turned off in order, with the voltage kept applied to the terminal 130.

Figure 6A:
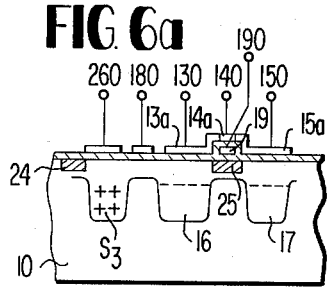
FIGS. 6a, 6b and 6c are sectional views taken along the line D–D' in FIG. 4 for illustrating the operation of the second embodiment.
Figure 6B:
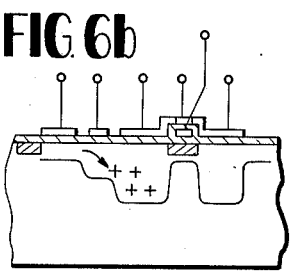
Figure 6C:
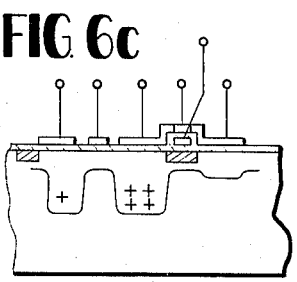

Referring to FIG. 6a, information charges are accumulated in the potential well in the sensor element $S_3$, in the manner as described with reference to FIG. 5. In order to transfer the information charges from the sensor element $S_3$ to the transfer array 17, pulses are applied in sequence to the electrodes 26 and 18, and the electrode 19 simultaneous with the terminals 130 and 150 in the manner described by referring to FIG. 5. By this operation, the information charges are transferred only to the transfer array 16 beneath the electrode 13a as shown in FIG. 6b because of a channel separation layer 25. Then the pulses applied to the control electrodes 18 and 19 are removed and a pulse is applied again to the sensing electrode 26 whereby information charges are accumulated again in the sensor element $S_3$, as shown in FIG. 6c and the charges transferred to the transfer array 16 are transferred along it.

The overall operation of the second embodiment will be described by referring to FIG. 4.

The minority charges developed by the light incident upon the sensor elements $S_1$, $S_2$, $S_n$ are accumulated in the potential wells formed underneath the sensor elements which are isolated from each other by the isolation layer 24. In order to transfer the information charges from the sensor array S to the individual transfer arrays, the pulse applied sequentially to the electrode 26 is turned off and pulses are applied to the electrodes 18 and 19, and to the terminals 130 and 140 simultaneous with the electrode 19. As a result, the information charge in the sensor element $S_1$ is transferred to the transfer array 16' beneath the electrode 15a' and to the transfer array 17' beneath the electrode 13a'; the charge in the sensor element $S_2$ to the transfer array 16' beneath the electrode 13a'; the charge in the sensor element $S_3$ to the transfer array 16 beneath the electrode 13a; and the charge in the sensor element $S_4$ to the transfer array 16 beneath the electrode 15b and to the transfer array 17 beneath the electrode 13a, in the manner as described by referring to FIGS. 5 and 6. Thus the information charges in the respective sensor elements are transferred to the corresponding transfer arrays.

The information charges in the sensor elements $S_1$, $S_4$, $S_5$, $S_8$ . . . . distributed over the transfer arrays 16(16') and 17(17') are transferred in the following manner. When the pulses being applied to the groups of electrodes connected to the terminals 150 and 150' are off, the signal in the sensor element $S_1$ is transferred to the transfer array 17' beneath the electrode 13a'; the signal in the sensor element $S_4$ to the transfer array 17 beneath the electrode 13a. Thus, the information charges are transferred to the transfer arrays beneath the same electrode. In this state, when pulses are applied to the terminals 120, 130, 140 and 150 in sequence, the information charges transferred to the transfer arrays are transferred in parallel to a read means 20.

In the first embodiment, there is a difference in surface potential between the transfer arrays 16 and 17, resulting in the difference in the transfer characteristics of the individual transfer arrays. While the signal charge in the sensor element $S_3$ is transferred up to the transfer array 16 because of the isolation layer 25, and the signal charge in the sensor element $S_4$ is transferred to the transfer arrays 16 and 17, turning off the voltage applied to the terminal 150 will cause the signal charge in the transfer array 16 to be re-transferred to the transfer array 17. In other words, the transferring function from the sensor elements $S_3$ and $S_4$ differs from each other.

Therefore, variations in the output signal occur due to the difference in the transfer characteristics of the individual transfer arrays or due to the difference in the mechanism of charge transfer.

Figure 7:
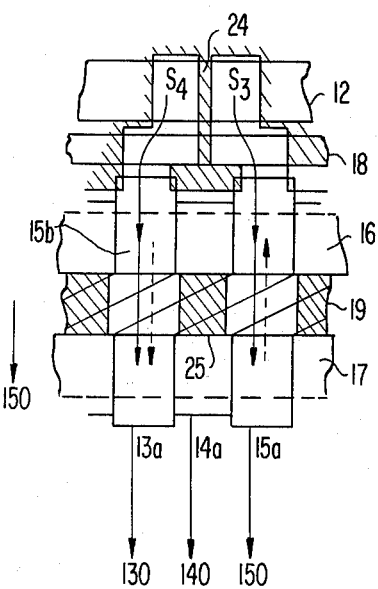
FIG. 7 is a schematic plan view of a third embodiment of the present invention realized as a modification from the second embodiment.

One solution to this will be described by referring to FIG. 7, in which only related the parts of the sensor elements $S_3$ and $S_4$ are shown. In the improved device shown in FIG. 7, the charge transferred from the sensor element $S_4$ to the corresponding transfer array moves in the manner similar to that of the second embodiment as shown in FIG. 5 and finally reaches the transfer array 17 beneath the electrode 13a. The charge transfer from the sensor element $S_3$ follows the manner illustrated in FIG. 6, excepting that no channel isolation layer 25 exists between the transfer arrays 16 and 17. Hence, the signal charge in the sensor element $S_3$ is first transferred to the transfer arrays 16 and 17 as indicated by the solid line, as in the case of the signal charge in the sensor element $S_4$. Then, by turning off the voltage applied to the electrode 15a connected to the terminal 150, the signal charge transferred thereto is moved back to the transfer array 16 beneath the electrode 13a as indicated by the dotted line in FIG. 7. By this arrangement, the movement of the signal charge in the sensor element $S_3$ becomes the same as that of the signal charge in the sensor element $S_4$, with the result that the characteristic difference due to charge transfer from the sensor element to the transfer array is eliminated.

The drive frequency for the transfer array may be half the video frequency.

While three preferred embodiments of the invention have been descrived above in connection with four-phase driven charge-coupled devices, it will be apparent that the principles of the invention may readily be applied to two-phase driven charge-coupled devices. Also, the concept of charge transfer along four rows of lines can be adapted to single phase or three-phase driven charge-coupled devices by switching the charge transfer drive from the sensor array to the transfer array. Furthermore, the invention is applicable to charge-coupled devices with a surface channel or with a buried channel or with any combination of means as long as the charge-coupled device has regions capable of operations on the principles of the invention as have been described.

What is claimed is:

1. A charge-coupled linear image sensing device comprising:
    an image sensor array having a plurality of image sensor elements to develop electric charges upon incidence of light rays thereon;
    first and second charge-transfer arrays disposed on opposite sides of said image sensor array, respectively, each having a plurality of charge-transfer stages corresponding to respectively ordered ones in each sequential set of four successive said image sensor elements;
    third and fourth charge-transfer arrays disposed between said image sensor array and said first and second charge-transfer arrays, respectively, each having a plurality of charge-transfer stages corresponding to respectively ordered ones in each sequential set of four successive said image sensor elements; and
    first means for transferring the charges developed in the four successive image sensor elements of said each set to said first, second, third and fourth charge-transfer arrays, respectively;
    said first transferring means including first and second electrodes disposed between said first and third charge-transfer arrays and between said second and fourth charge-transfer arrays, respectively, and third and fourth electrodes being disposed between said image sensor array and said third and fourth charge-transfer arrays, respectively;
    second means for transferring the developed charges transferred from said image sensor array to said first, second, third and fourth charge-transfer arrays therein; said second transferring means including a plurality of charge-transfer electrodes disposed to extend between said first and third charge-transfer arrays and between said second and fourth charge-transfer arrays, respectively.

2. A charge-coupled linear image sensing device as claimed in claim 1 wherein said first transferring means includes isolation layers disposed between said first and third charge-transfer arrays and between said second and fourth charge-transfer arrays for preventing the charge transfer from said third and fourth charge-transfer arrays to said first and second charge-transfer arrays, respectively.

3. A charge-coupled linear image sensing device as claimed in claim 1 wherein said charge-transfer electrodes are disposed slantingly with respect to said charge-transfer arrays.

4. A charge-coupled linear image sensing device as claimed in claim 3 wherein said first transferring means includes means for controlling the charge transfer from said image sensor array to said charge-transfer arrays so that the charges in two image sensor elements of said each set of said four successive image sensor elements are transferred to said first and second arrays and then back to said third and fourth arrays, respectively.

* * * * *

UNITED STATES PATENT AND TRADEMARK OFFICE
CERTIFICATE OF CORRECTION

PATENT NO. : 3,983,573
DATED : September 28, 1976
INVENTOR(S) : Yasuo ISHIHARA

It is certified that error appears in the above-identified patent and that said Letters Patent are hereby corrected as shown below:

Column 1, line 48 - before "two" delete "the"

Column 2, line 28 - after "120" delete " , respectively"

line 28 - after "120' " insert -- , respectively -- line 44 - after "developed" insert -- at --

Column 3, line 20 - after "layer 11" insert a comma line 21 - after "localization of" delete the comma line 31 - delete "electronhole" and insert -- electron-hole -- line 63 - delete "140" (second occurrence) and insert -- 150 --

Column 4, line 35 - after "190" insert -- and -- line 59 - delete "undermath" and insert -- underneath -- line 65 - after "charges" insert -- transferred in parallel along the four transfer arrays are led in sequence --

Column 6, line 14 - after "$S_8$" insert a comma line 47 - delete "related the" and insert -- the related --

Column 7, line 6 - delete "descrived" and insert -- described --

Signed and Sealed this

Twenty-sixth Day of April 1977

[SEAL]

Attest:

RUTH C. MASON
Attesting Officer

C. MARSHALL DANN
Commissioner of Patents and Trademarks